United States Patent
Lin (10) Patent No.: US 10,812,111 B2
(45) Date of Patent: Oct. 20, 2020

(54) SEMICONDUCTOR APPARATUS

(71) Applicants: Kabushiki Kaisha Toshiba, Minato-ku, Tokyo (JP); Toshiba Electronic Devices & Storage Corporation, Minato-ku, Tokyo (JP)

(72) Inventor: Keisyun Lin, Kawasaki Kanagawa (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 0 days.

(21) Appl. No.: 16/121,323

(22) Filed: Sep. 4, 2018

(65) Prior Publication Data

US 2019/0288709 A1 Sep. 19, 2019

(30) Foreign Application Priority Data

Mar. 19, 2018 (JP) ................................ 2018-051138

(51) Int. Cl.
*H03M 13/29* (2006.01)
*G06F 11/10* (2006.01)

(52) U.S. Cl.
CPC ..... *H03M 13/2906* (2013.01); *G06F 11/1076* (2013.01)

(58) Field of Classification Search
CPC .............. H03M 13/2906; G06F 11/1076
See application file for complete search history.

(56) References Cited

U.S. PATENT DOCUMENTS

| | | | |
|---|---|---|---|
| 5,215,537 A | 6/1993 | Lynn et al. | |
| 5,608,891 A * | 3/1997 | Mizuno | G06F 3/0601 711/113 |
| 7,424,648 B2 | 9/2008 | Honda | |
| 9,564,765 B2 | 2/2017 | Fukute et al. | |
| 2006/0080580 A1* | 4/2006 | Conti | G06F 21/64 714/52 |
| 2006/0156075 A1 | 7/2006 | Mitsuishi | |

(Continued)

FOREIGN PATENT DOCUMENTS

| | | |
|---|---|---|
| JP | 2005-149183 | 6/2005 |
| JP | 2006-171952 A | 6/2006 |

(Continued)

OTHER PUBLICATIONS

Chen, P-Y., et al., "An Enhanced EDAC Methodology for Low Power PSRAM", 2006 IEEE International Test Conference, Conference Location: Santa Clara, CA, USA, Date of Conference: Oct. 22-27, 2006, pp. 1-10. (Year: 2006).*

*Primary Examiner* — Kyle Vallecillo
(74) *Attorney, Agent, or Firm* — White & Case LLP (57) ABSTRACT

A semiconductor apparatus includes a storage unit, an ECC decoder, and a selection unit. The storage unit stores data. The ECC decoder can detect and correct an error of a predetermined number of bits in data outputted from the storage unit, and can detect an error equal to or larger than bits larger than the predetermined number of bits in the data. The selection unit selects and outputs one of the data outputted from the ECC decoder and a preset fixed value, in accordance with a detection signal indicating whether or not the error equal to or larger than the bits larger than the predetermined number of bits is detected by the ECC decoder.

16 Claims, 6 Drawing Sheets

(56) References Cited

U.S. PATENT DOCUMENTS

| | | | |
|---|---|---|---|
| 2007/0124653 A1* | 5/2007 | Conti | G06F 11/1044 |
| | | | 714/781 |
| 2010/0169546 A1* | 7/2010 | Van Acht | G06F 9/4812 |
| | | | 711/103 |
| 2014/0229793 A1* | 8/2014 | Campbell | G06F 11/1048 |
| | | | 714/763 |
| 2017/0242823 A1 | 8/2017 | Kamegai et al. | |

FOREIGN PATENT DOCUMENTS

| | | |
|---|---|---|
| JP | 2006-285976 A | 10/2006 |
| JP | 09-282237 A | 1/2008 |
| JP | 2008-011078 A | 1/2008 |
| JP | 5905588 B2 | 4/2016 |
| JP | 2017-146897 A | 8/2017 |

\* cited by examiner

SEMICONDUCTOR APPARATUS

CROSS-REFERENCE TO RELATED APPLICATION

This application is based upon and claims the benefit of priority from the prior Japanese Patent Application No. 2018-051138 filed on Mar. 19, 2018; the entire contents of which are incorporated herein by reference.

FIELD

Embodiments described herein relate generally to a semiconductor apparatus.

BACKGROUND

With recent progression in processes, rapid progress has been made in miniaturizing SRAMs. In SRAMs, data errors caused by radiation from outer space, etc., noise inside circuits, failures in the SRAMs themselves, and the like, have noticeably increased.

Accordingly, a semiconductor apparatus provided with an SRAM includes an ECC encoder and an ECC decoder to correct data errors in the SRAM, whereby functional safety is enhanced. In typical error correction to be executed by such a semiconductor apparatus, an error of one bit can be corrected while an error of two bits or more can be detected.

When an error of two bits or more is detected, the semiconductor apparatus cannot correct the error. Therefore, an unanticipated operation may be executed in the semiconductor apparatus. In particular, functional safety is demanded for apparatuses that are used in the field of in-vehicle components or in the field of outer space or the like. Consequently, maintaining the functional safety, when an error of two bits or more is detected, is important for such apparatuses.

DETAILED DESCRIPTION

A semiconductor apparatus according to embodiments described herein includes a storage unit, an ECC decoder, and a selection unit. The storage unit stores data. The ECC decoder can detect and correct an error of a predetermined number of bits in data outputted from the storage unit, and can detect an error equal to or larger than bits larger than the predetermined number of bits in the data. The selection unit selects and outputs one of the data outputted from the ECC decoder and a preset fixed value, in accordance with a detection signal indicating whether or not the error equal to or larger than the bits larger than the predetermined number of bits is detected by the ECC decoder.

Hereinafter, embodiments are described in detail with reference to the drawings.

First Embodiment

Figure 1:
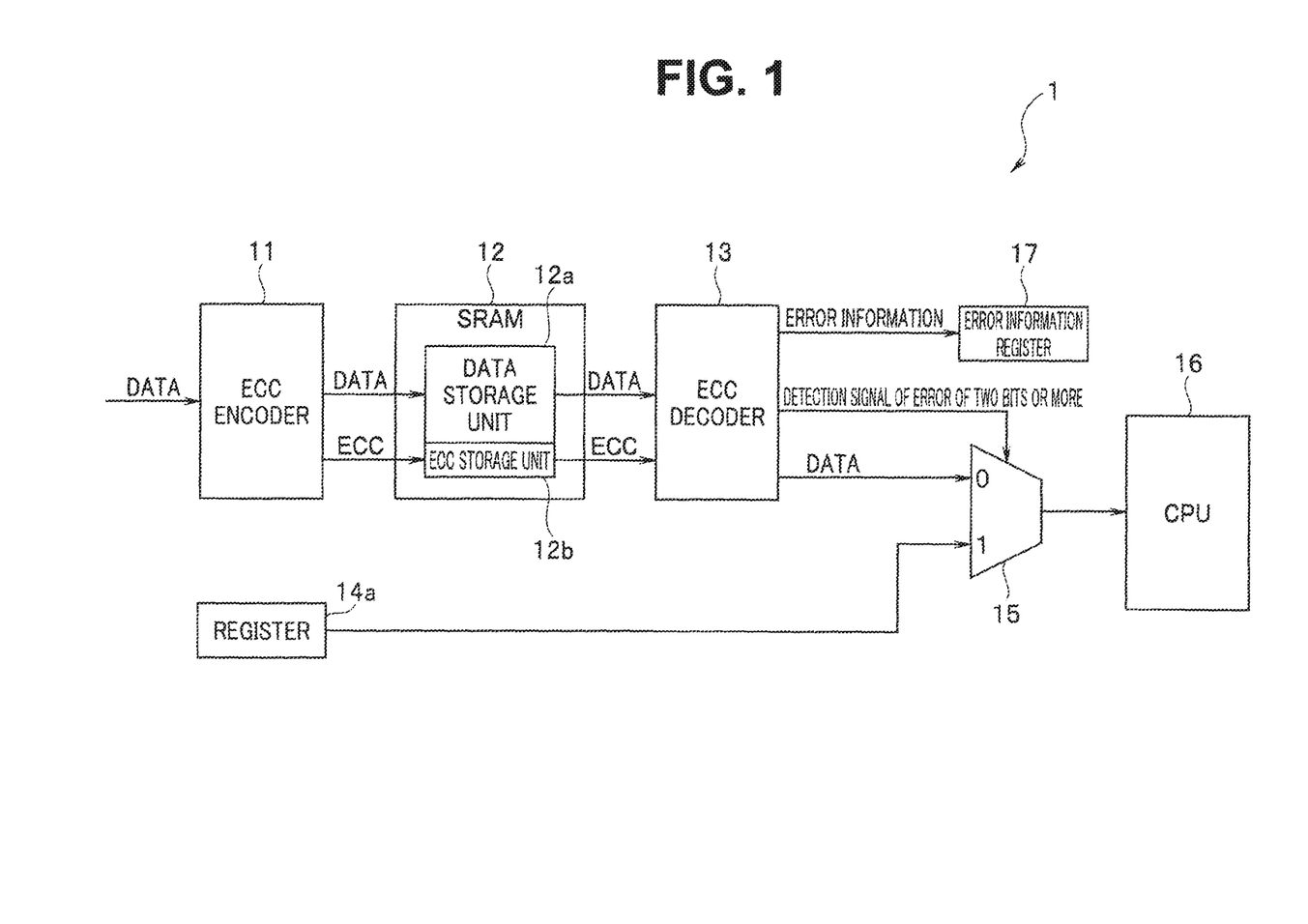
FIG. 1 is a block diagram illustrating a configuration of a semiconductor apparatus according to a first embodiment.

First, a description is given of a configuration of a semiconductor apparatus according a first embodiment, on the basis of FIG. 1. FIG. 1 is a block diagram illustrating the configuration of the semiconductor apparatus according to the first embodiment.

A semiconductor apparatus 1 of the first embodiment includes an ECC encoder 11, an SRAM 12, an ECC decoder 13, a register 14a, a multiplexer 15, a CPU 16, and an error information register 17. The SRAM 12 includes a data storage unit 12a and an ECC storage unit 12b.

Data stored in the SRAM 12 is inputted to the ECC encoder 11. The ECC encoder 11 encodes the inputted data, and outputs the data and an ECC (an error-correction code) to the SRAM 12.

The SRAM 12 as the storage unit stores the data from the ECC encoder 11 in the data storage unit 12a, and stores the ECC in the ECC storage unit 12b. When the data stored in the SRAM 12 is read out, the data stored in the data storage unit 12a and the ECC stored in the ECC storage unit 12b are inputted to the ECC decoder 13. In the present embodiment, the SRAM 12 is used as the storage unit. However, the storage unit is not limited to the SRAM 12, but may be a ROM or a NAND flash memory, for example.

The ECC decoder 13 can detect and correct an error of one bit, and can detect an error of two bits or more in the data. The ECC decoder 13 decodes the data and the ECC inputted from the SRAM 12.

The ECC decoder 13 outputs the data from the SRAM 12 to the multiplexer 15. Here, when no error is included in the data from the SRAM 12, the ECC decoder 13 outputs the data including no error to the multiplexer 15, and when an error of one bit is included in the data from the SRAM 12, the ECC decoder 13 outputs, to the multiplexer 15, resultant data in which the error of one bit has been corrected. When an error of two bits or more is included in the data from the SRAM 12, the ECC decoder 13 cannot correct the error. Accordingly, the ECC decoder 13 outputs the data including the error of two bits or more to the multiplexer 15.

Also, when an error of one bit or more is included in the data from the SRAM 12, the ECC decoder 13 outputs error information to the error information register 17. The error information held in the error information register 17 can be read out by the CPU 16, for example.

Further, the ECC decoder 13 outputs a detection signal regarding an error of two bits or more to the multiplexer 15. For example, the ECC decoder 13 outputs a detection signal "O" to the multiplexer 15 when no error of two bits or more is included in the data from the SRAM 12, and the ECC decoder 13 outputs a detection signal "1" to the multiplexer 15 when an error of two bits or more is included in the data from the SRAM 12.

A fixed value (a preset fixed value) for maintaining functional safety of the semiconductor apparatus 1 is stored in the register 14a. The fixed value stored in the register 14a is inputted to the multiplexer 15.

The multiplexer 15 as the selection unit selects one of the data from the ECC decoder 13 and the fixed value from the register 14a in accordance with the detection signal regarding an error of two bits or more, and outputs the selected one to the CPU 16. More specifically, when no error of two bits or more is included in the data from the SRAM 12 and the detection signal "0" is inputted to the multiplexer 15, the multiplexer 15 outputs the data from the ECC decoder 13 to the CPU 16. When an error of two bits or more is included in the data from the SRAM 12 and the detection signal "1" is inputted to the multiplexer 15, the multiplexer 15 outputs the fixed value from the register 14a to the CPU 16.

Consequently, when no error of two bits or more is included in the data from the SRAM 12, the data having been inputted from the SRAM 12 and including no error or resultant data in which an error of one bit has been corrected and no error is included, is outputted to the CPU 16.

On the other hand, when an error of two bits or more which cannot be corrected is included in the data from the SRAM 12, the fixed value for securing the safe state of the semiconductor apparatus 1, held in the register 14a, is outputted to the CPU 16.

As a result, even when an error of two bits or more is included in data from the SRAM 12, the functional safety of the semiconductor apparatus 1 can be maintained.

It is noted that, although the semiconductor apparatus 1 of the present embodiment includes the ECC decoder 13 capable of detecting and correcting an error of one bit, and detecting an error of two bits or more in the data, the semiconductor apparatus 1 is not limited to this configuration. For example, the ECC decoder 13 may be configured to be capable of detecting and correcting an error of two bits in the data, and detecting an error of three bits or more. The ECC decoder 13 may also be configured to be capable of detecting and correcting an error of three bits in the data, and detecting an error of four bits or more.

That is, the ECC decoder 13 is configured to be capable of detecting and correcting an error of a predetermined number of bits in the data outputted from the SRAM 12, and detecting an error equal to or larger than bits larger than the predetermined number of bits. The multiplexer 15, which serves as the selection unit, selects and outputs to the CPU 16, one of the data from the ECC decoder 13 and the fixed value from the register 14a in accordance with the detection signal indicating whether or not the error equal to or larger than the bits larger than the predetermined number of bits is detected by the ECC decoder 13. As a result, the semiconductor apparatus 1 is enabled to maintain safety even when the data from the SRAM 12 has an error equal to or larger than bits larger than the predetermined number of bits.

(Modification)

Next, a description is given of a modification of the first embodiment.

Figure 2:
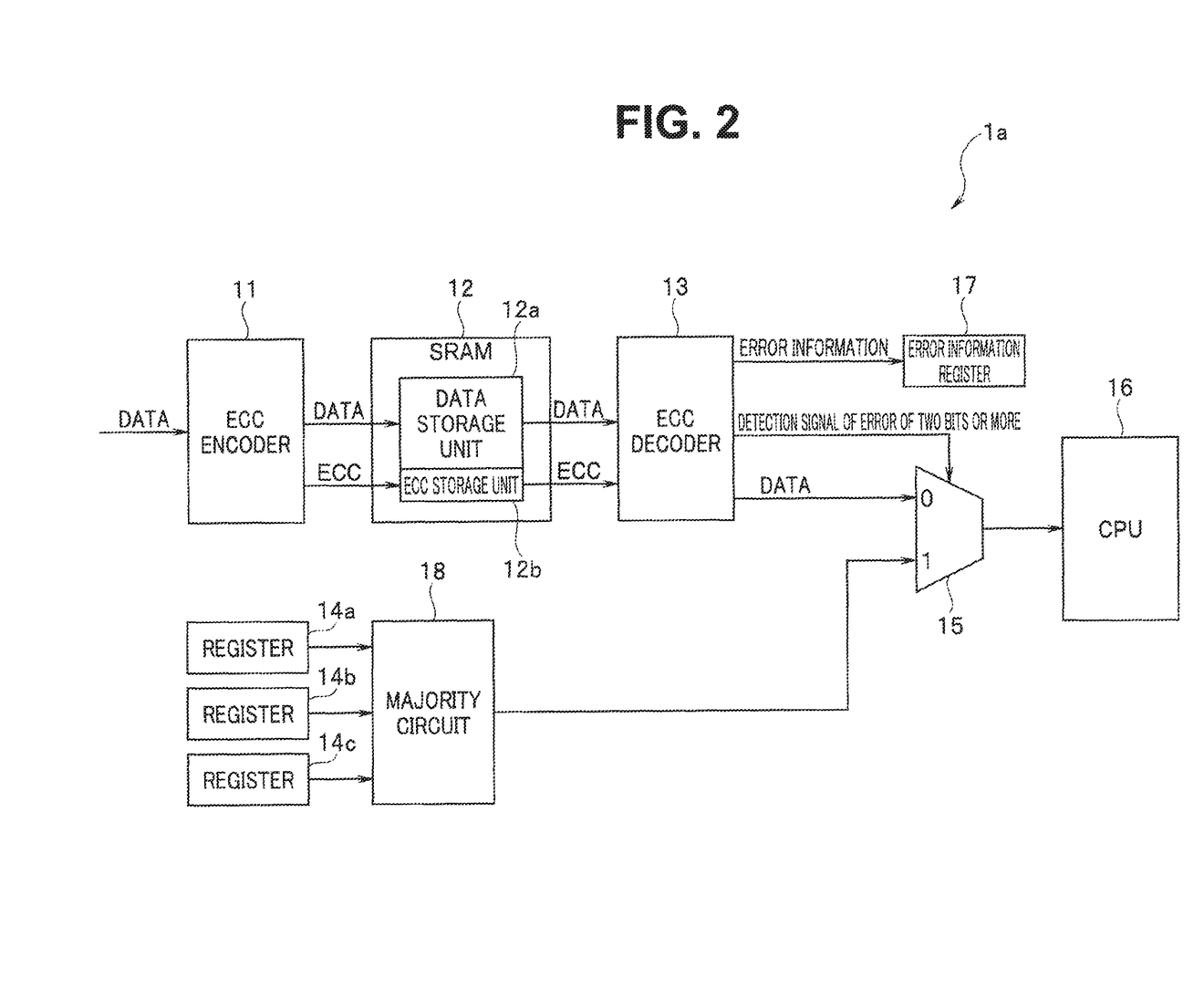
FIG. 2 is a block diagram illustrating a configuration of a semiconductor apparatus according to a modification of the first embodiment.

FIG. 2 is a block diagram illustrating a configuration of a semiconductor apparatus according to the modification of the first embodiment. In FIG. 2, components identical to the components in FIG. 1 are denoted by the same reference numerals, and an explanation of the components is omitted.

As illustrated in FIG. 2, a semiconductor apparatus 1a is formed by adding a register 14b, a register 14c, and a majority circuit 18 to the semiconductor apparatus 1 in FIG. 1. Namely, the semiconductor apparatus 1a is obtained by multiplexing (triplexing, in the case in FIG. 2) the register 14a of the semiconductor apparatus 1 in FIG. 1. In the semiconductor apparatus 1a, the register 14a of the semiconductor apparatus 1 in FIG. 1 is triplexed. However, the register is not limited to the configuration, but may be quadruplexed.

Fixed values for securing the safe state of the semiconductor apparatus 1a are stored in the registers 14a, 14b, 14c. The fixed values stored in the registers 14a, 14b, 14c are inputted to the majority circuit 18.

The majority circuit 18 determines a majority of the fixed values inputted from the registers 14a, 14b, 14c by making a majority decision, and outputs the fixed value determined by the majority decision to the multiplexer 15. The remaining components are identical to the components of the first embodiment.

The fixed value held in the register 14a may be replaced by an unintended fixed value due to a malfunction or noise, etc., in the register 14a. In the semiconductor apparatus 1 of the first embodiment, when the fixed value held in the register 14a is replaced by an unintended fixed value, the functional safety of the semiconductor apparatus 1 may not be maintained.

In contrast, in the semiconductor apparatus 1a of the modification, when the fixed value held in the register 14a is replaced by an unintended fixed value, the fixed values for securing the safe state of the semiconductor apparatus 1a are inputted from the registers 14b, 14c to the majority circuit 18. A fixed value for securing the safe state of the semiconductor apparatus 1a is selected through a majority decision made by the majority circuit 18, and is outputted to the multiplexer 15.

Therefore, the functional safety of the semiconductor apparatus 1a of the modification can be more reliably maintained than the semiconductor apparatus 1 of the first embodiment.

Second Embodiment

Next, a description is given of a second embodiment.

In the second embodiment, a case where the ECC encoder 11, the SRAM 12, and the ECC decoder 13 of the first embodiment are applied to a memory unit that holds a vector address (a jump destination address of an interruption process) to be selected by an interruption controller is described.

Figure 3:
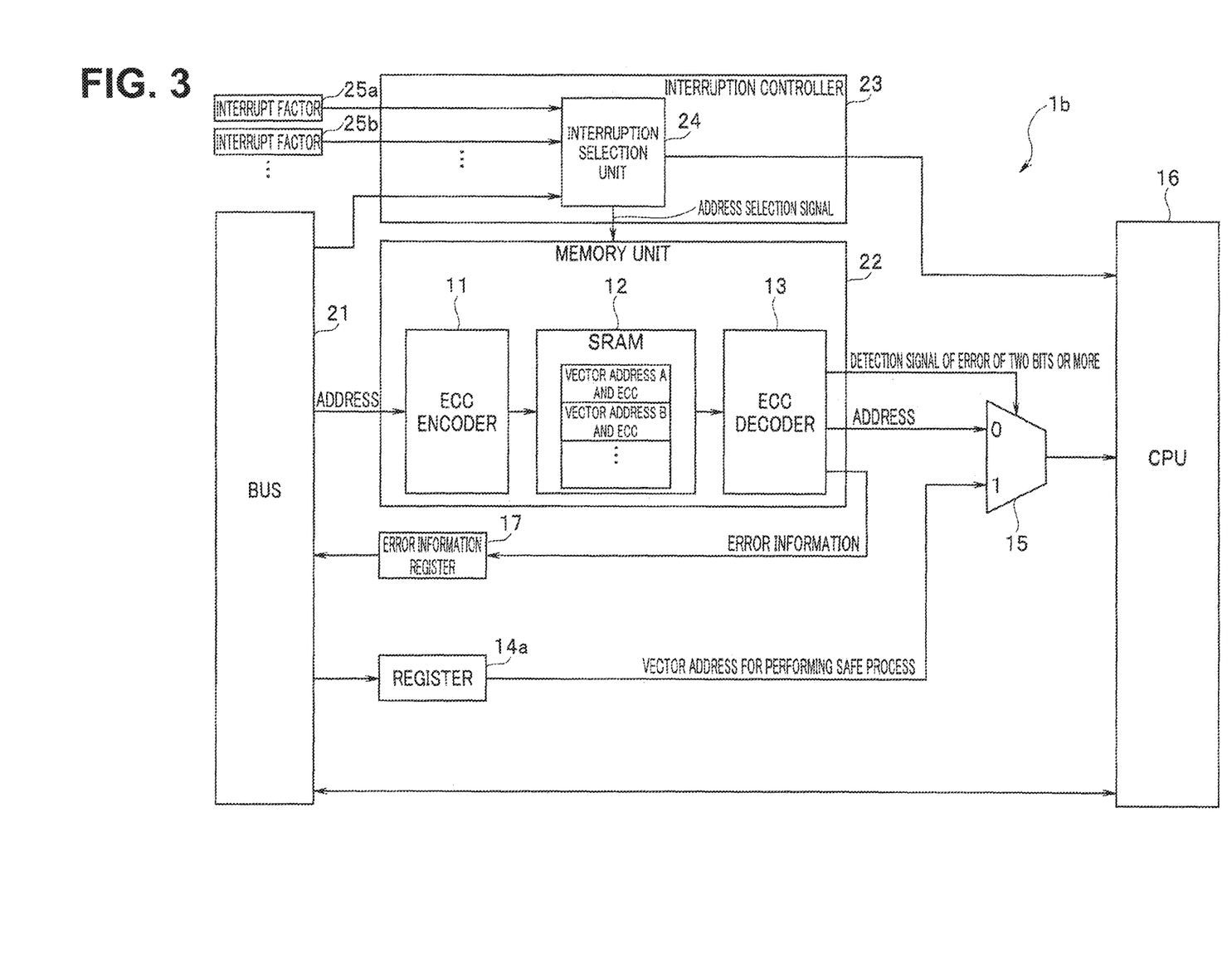
FIG. 3 is a block diagram illustrating a configuration of a semiconductor apparatus according to a second embodiment.

FIG. 3 is a block diagram illustrating a configuration of a semiconductor apparatus according to the second embodiment. In FIG. 3, components identical to the components in FIG. 1 are denoted by the same reference numerals, and an explanation of the components is omitted.

A semiconductor apparatus 1b is formed by adding a bus 21, a memory unit 22 that holds a vector address, and an interruption controller 23 to the semiconductor apparatus 1 in FIG. 1. The interruption controller 23 includes an interruption selection unit 24.

The memory unit 22 that holds a vector address includes the ECC encoder 11, the SRAM 12, and the ECC decoder 13. The vector address is inputted to the ECC encoder 11 via the bus 21. The ECC encoder 11 encodes the inputted vector address, and outputs the vector address and an ECC to the SRAM 12. Accordingly, a plurality of vector addresses are stored in the SRAM 12.

A plurality of interrupt factors 25a, 25b, . . . are inputted to the interruption selection unit 24 of the interruption controller 23. The interruption selection unit 24 outputs, to the CPU 16, an interrupt signal so as to cause the CPU 16 to execute an interruption process having the highest priority among the interrupt factors 25a, 25b, . . . . Further, the interruption selection unit 24 outputs, to the memory unit 22, an address selection signal to select a vector address for allowing execution of the interrupt process having the highest priority. As a result, the selected vector address and the ECC are inputted from the SRAM 12 to the ECC decoder 13.

The ECC decoder 13 decodes the vector address and the ECC inputted from the SRAM 12. When no error is included in the vector address from the SRAM 12, the ECC decoder 13 outputs the vector address including no error to the multiplexer 15, and when an error of one bit is included in the vector address from the SRAM 12, the ECC decoder 13 outputs, to the multiplexer 15, a resultant vector address in which the error of one bit has been corrected. When an error of two bits or more is included in the vector address from the SRAM 12, the ECC decoder 13 cannot correct the error. Accordingly, the ECC decoder 13 outputs the vector address including the error of two bits or more to the multiplexer 15.

Further, the ECC decoder 13 outputs a detection signal regarding an error of two bits or more to the multiplexer 15. For example, when no error of two bits or more is included in the vector address from the SRAM 12, the ECC decoder 13 outputs a detection signal "0" to the multiplexer 15, and when an error of two bits or more is included in the vector address from the SRAM 12, the ECC decoder 13 outputs a detection signal "1" to the multiplexer 15.

The register 14a stores the vector address for allowing execution of a safe process (a vector address for allowing execution of a preset process), which is inputted via the bus 21 to the register 14a. The vector address for allowing execution of a safe process stored in the register 14a is inputted to the multiplexer 15.

The multiplexer 15 selects one of the vector address from the ECC decoder 13 and the vector address from the register 14a for allowing execution of a safe process, in accordance with the detection signal regarding an error of two bits or more, and outputs the selected vector address to the CPU 16. More specifically, when no error of two bits or more is included in the vector address from the SRAM 12 and a detection signal "0" is inputted to the multiplexer 15, the multiplexer 15 outputs the vector address from the ECC decoder 13 to the CPU 16. When an error of two bits or more is included in the vector address from the SRAM 12 and a detection signal "1" is inputted to the multiplexer 15, the multiplexer 15 outputs, to the CPU 16, the vector address from the register 14a for allowing execution of a safe process.

Consequently, when no error of two bits or more is included in the vector address from the SRAM 12, the vector address having been inputted from the SRAM 12 and including no error, or a resultant vector address in which an error of one bit has been corrected and no error is included, is outputted to the CPU 16.

On the other hand, when an error of two bits or more which cannot be corrected is included in the vector address from the SRAM 12, the vector address for allowing execution of a safe process, held in the register 14a, is outputted to the CPU 16.

When a vector address including an error of two bits or more and having been outputted from the ECC decoder 13 is inputted to the CPU, a runaway of the CPU 16 may be caused. To address such a runaway, the semiconductor apparatus 1b of the present embodiment is configured such that, when an error of two bits or more is included in the vector address stored in the SRAM 12, the vector address for allowing execution of a safe process, held in the register 14a, is selected by the multiplexer 15 and is inputted to the CPU 16.

As a result, even when an error of two bits or more is included in a vector address from the SRAM 12, the functional safety of the semiconductor apparatus 1b can be maintained.

(Modification)

Next, a description is given of a modification of the second embodiment.

Figure 4:
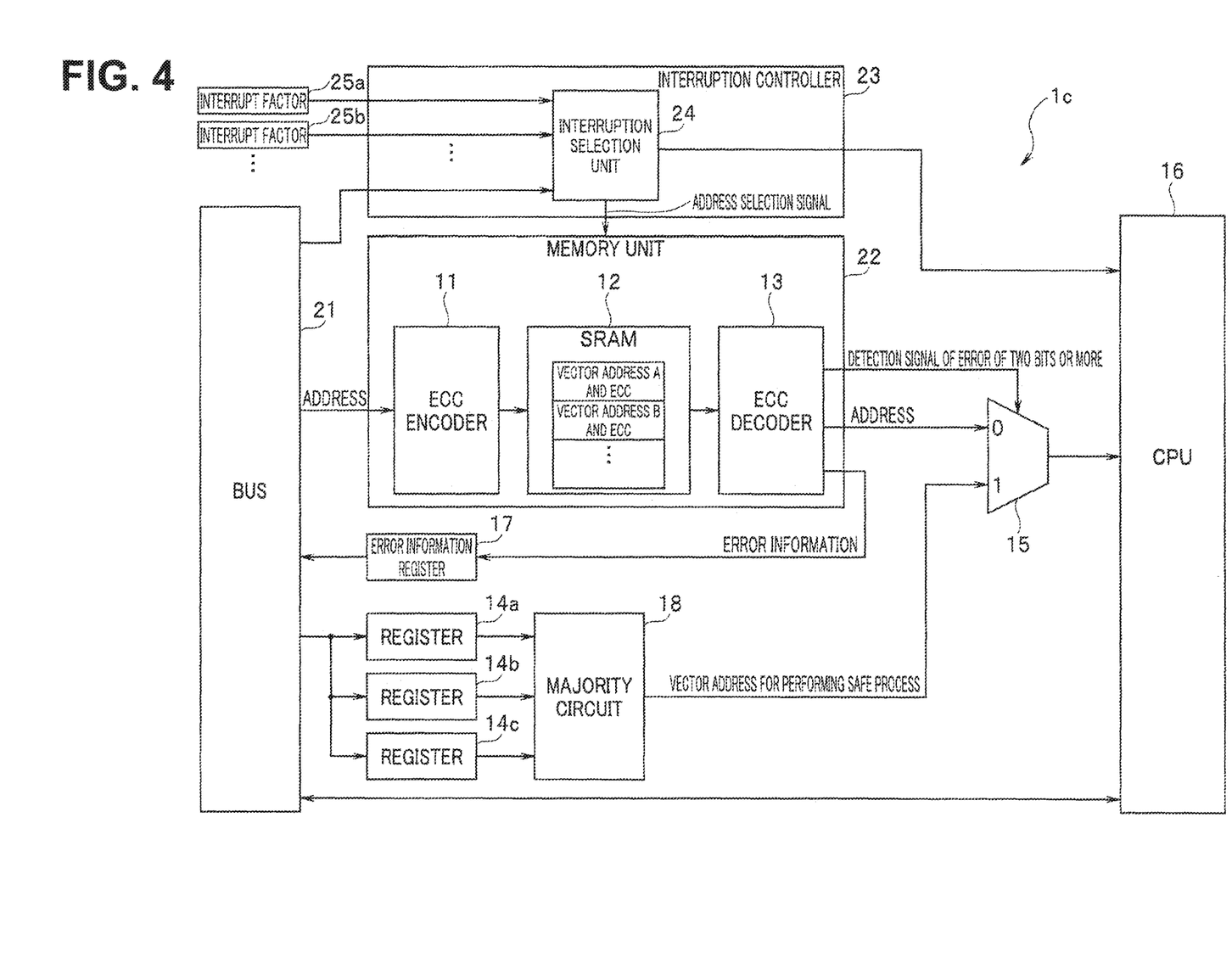
FIG. 4 is a block diagram illustrating a configuration of a semiconductor apparatus according to a modification of the second embodiment.

FIG. 4 is a block diagram illustrating a configuration of a semiconductor apparatus according to the modification of the second embodiment. In FIG. 4, components identical to the components in FIG. 3 are denoted by the same reference numerals, and an explanation of the components is omitted.

As illustrated in FIG. 4, a semiconductor apparatus 1c is formed by adding the register 14b, the register 14c, and the majority circuit 18 to the semiconductor apparatus 1b in FIG. 3. Namely, the semiconductor apparatus 1c is obtained by multiplexing (triplexing in the case in FIG. 4) the register 14a of the semiconductor apparatus 1b in FIG. 3. In the semiconductor apparatus 1c, the register 14a of the semiconductor apparatus 1b in FIG. 3 is triplexed. However, the register is not limited to the configuration, but may be quadruplexed.

Vector addresses for allowing execution of a safe process inputted to the registers 14a, 14b, 14c via the bus 21 are stored in the registers 14a, 14b, 14c. The vector addresses for allowing execution of a safe process stored in the registers 14a, 14b, 14c are inputted to the majority circuit 18.

The majority circuit 18 determines a majority of the vector addresses inputted from the registers 14a, 14b, 14c by making a majority decision, and outputs the vector address determined by the majority decision to the multiplexer 15. The remaining components are identical to the components of the second embodiment.

The vector address for allowing execution of a safe process held in the register 14a may be replaced by an unintended vector address due to a malfunction or noise, etc., in the register 14a. In the semiconductor apparatus 1b of the second embodiment, when the vector address for securing a safe process held in the register 14a is replaced by an unintended vector address, a runaway of the CPU 16, for example, may be caused, and the functional safety of the semiconductor apparatus 1b may not be maintained.

To address such a runaway, the semiconductor apparatus 1c of the modification is configured such that, when the vector address for allowing execution of a safe process held in the register 14a is replaced by an unintended vector address, vector addresses for allowing execution of a safe process are inputted from the registers 14b, 14c to the majority circuit 18. A vector address for allowing execution of a safe process is selected through a majority decision made by the majority circuit 18, and is outputted to the multiplexer 15.

Therefore, the functional safety of the semiconductor apparatus 1c of the modification can be more reliably maintained than the semiconductor apparatus 1b of the second embodiment.

Third Embodiment

Next, a description is given of a third embodiment.

In the third embodiment, a case where the ECC encoder 11, the SRAM 12, and the ECC decoder 13 of the first embodiment are applied to a memory unit that holds an instruction code for a DMA controller (hereinafter, referred to as DMAC) is described.

Figure 5:
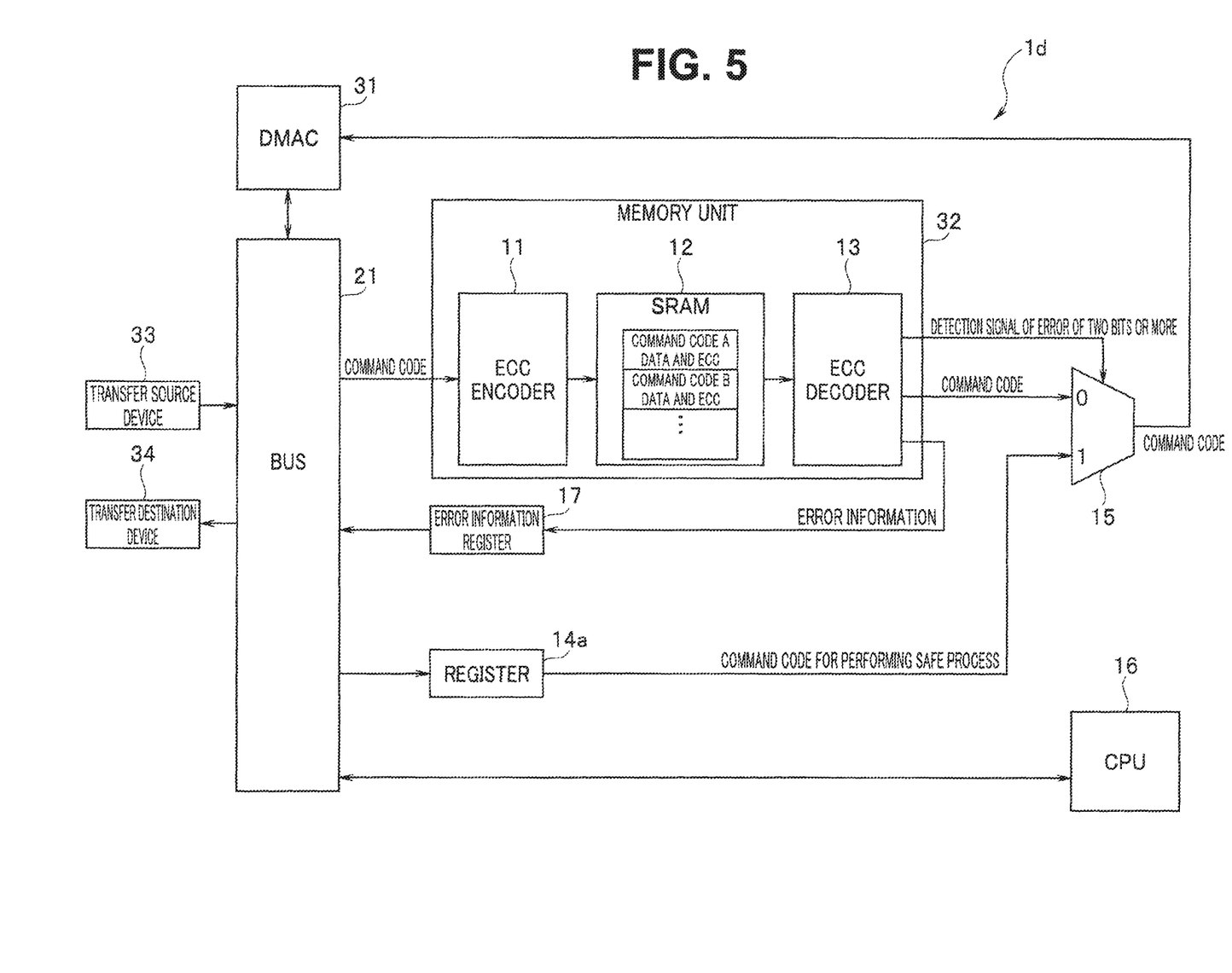
FIG. 5 is a block diagram illustrating a configuration of a semiconductor apparatus according to a third embodiment.

FIG. 5 is a block diagram illustrating a configuration of a semiconductor apparatus according to the third embodiment. In FIG. 5, components identical to the components in FIGS. 1 and 3 are denoted by the same reference numerals, and an explanation of the components is omitted.

A semiconductor apparatus 1d is formed by adding the bus 21, a DMAC 31, a memory unit 32 that holds an instruction code (a command sequence) for the DMAC 31, a transfer source device 33, and a transfer destination device 34 to the semiconductor apparatus 1 in FIG. 1.

The memory unit 32 that holds the instruction code includes the ECC encoder 11, the SRAM 12, and the ECC decoder 13. The ECC encoder 11 encodes the instruction code inputted to the ECC encoder 11 via the bus 21, and outputs the instruction code and an ECC to the SRAM 12. Accordingly, a plurality of instruction codes for the DMAC 31 and ECCs are stored in the SRAM 12.

The ECC decoder 13 decodes an instruction code and an ECC read from the SRAM 12. When no error is included in the instruction code from the SRAM 12, the ECC decoder 13 outputs the instruction code including no error to the multiplexer 15. When an error of one bit is included in the instruction code from the SRAM 12, the ECC decoder 13 outputs, to the multiplexer 15, a resultant instruction code in which the error of one bit has been corrected. When an error of two bits or more is included in the instruction code from the SRAM 12, the ECC decoder 13 cannot correct the error. Accordingly, the ECC decoder 13 outputs the instruction code including the error of two bits or more to the multiplexer 15.

Further, the ECC decoder 13 outputs a detection signal regarding an error of two bits or more to the multiplexer 15. For example, when no error of two bits or more is included in the instruction code from the SRAM 12, the ECC decoder 13 outputs a detection signal "0" to the multiplexer 15, and when an error of two bits or more is included in the instruction code from the SRAM 12, the ECC decoder 13 outputs a detection signal "1" to the multiplexer 15.

The register 14a stores the instruction code for allowing execution of a safe process (instruction code for execution of a preset process), inputted to the register 14a via the bus 21. The instruction code for allowing execution of a safe process stored in the register 14a is inputted to the multiplexer 15.

The multiplexer 15 selects one of the instruction code from the ECC decoder 13 and the instruction code for allowing execution of a safe process from the register 14a in accordance with the detection signal regarding an error of two bits or more, and outputs the selected instruction code to the CPU 16. More specifically, when no error of two bits or more is included in the instruction code from the SRAM 12 and a detection signal "0" is inputted to the multiplexer 15, the multiplexer 15 outputs the instruction code from the ECC decoder 13 to the CPU 16. When an error of two bits or more is included in the instruction code from the SRAM 12 and a detection signal "1" is inputted to the multiplexer 15, the multiplexer 15 outputs the instruction code from the register 14a for allowing execution of a safe process to the CPU 16.

By processing the instruction code from the SRAM 12 of the memory unit 32, the DMAC 31 can perform control to cause direct transfer of data from the transfer source device 33 to the transfer destination device 34 via the bus 21. However, when an error of two bits or more is included, the instruction code for allowing execution of a safe process stored in the register 14a is selected by the multiplexer 15, and is inputted to the DMAC 31. The DMAC 31 executes the inputted instruction code for allowing execution of a safe process, so that erroneous transfer of data can be prevented.

As a result, even when an error of two bits or more is included in an instruction code from the SRAM 12, the functional safety of the semiconductor apparatus 1d can be maintained.

(Modification)

Next, a description is given of a modification of the third embodiment.

Figure 6:
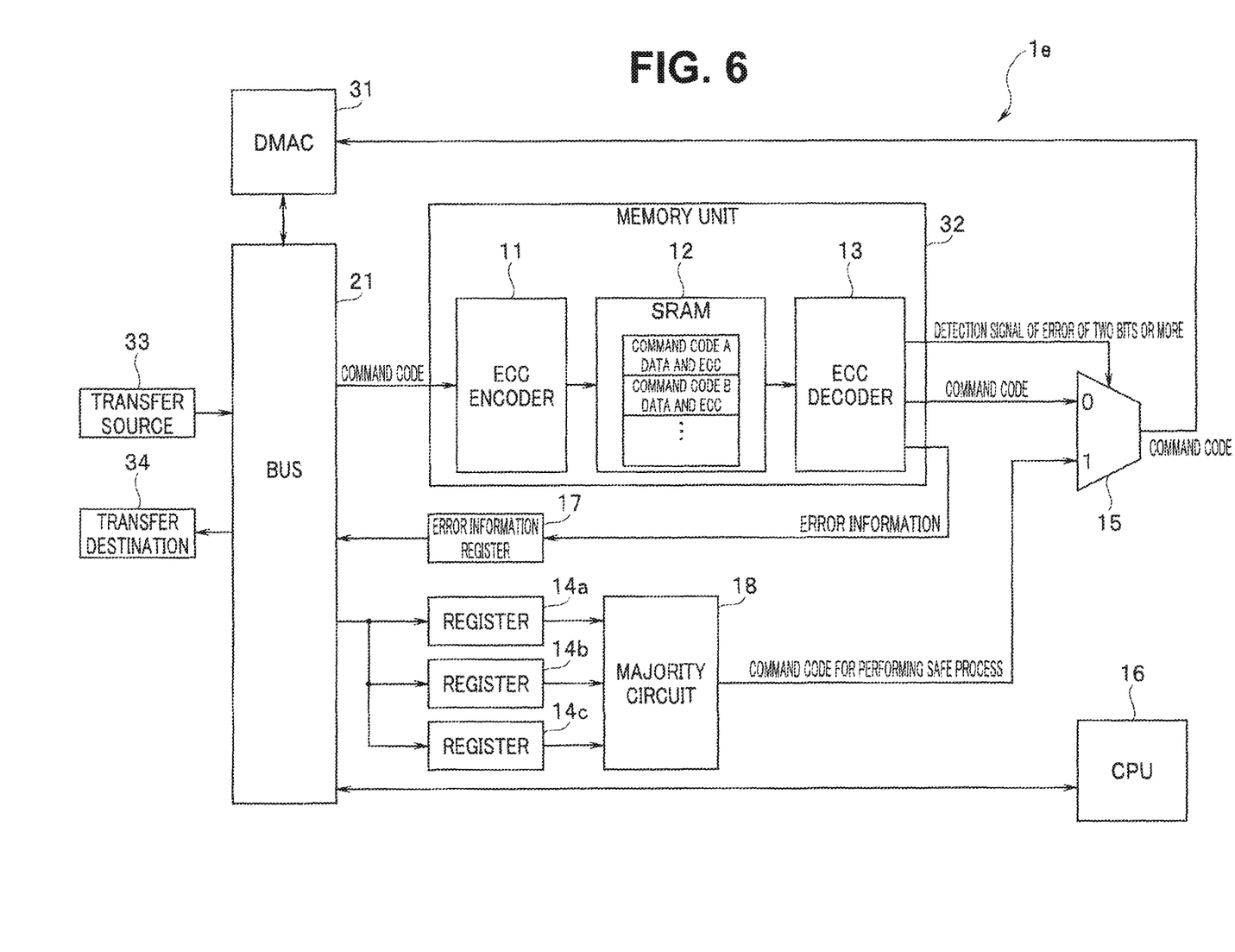
FIG. 6 is a block diagram illustrating a configuration of a semiconductor apparatus according to a modification of the third embodiment.

FIG. 6 is a block diagram illustrating a configuration of a semiconductor apparatus according to the modification of the third embodiment. In FIG. 6, components identical to the components in FIG. 5 are denoted by the same reference numerals, and an explanation of the components is omitted.

As illustrated in FIG. 6, a semiconductor apparatus 1e is formed by adding the register 14b, the register 14c, and the majority circuit 18 to the semiconductor apparatus 1d in FIG. 5. Namely, the semiconductor apparatus 1e is obtained by multiplexing (triplexing in the case in FIG. 6) the register 14a of the semiconductor apparatus 1d in FIG. 5. In the semiconductor apparatus 1e, the register 14a of the semiconductor apparatus 1d in FIG. 5 is triplexed. However, the register is not limited to the configuration, but may be quadruplexed.

Instruction codes for allowing execution of a safe process are inputted to the registers 14a, 14b, 14c via the bus 21, and are stored in the registers 14a, 14b, 14c. The instruction codes for allowing execution of a safe process stored in the registers 14a, 14b, 14c are inputted to the majority circuit 18.

The majority circuit 18 determines a majority of the instruction codes inputted from the registers 14a, 14b, 14c by making a majority decision, and outputs the instruction code determined by the majority decision to the multiplexer 15. The remaining components are identical to the components of the third embodiment.

The instruction code for allowing execution of a safe process held in the register 14a may be replaced by an unintended instruction code due to a malfunction or noise, etc., in the register 14a. In the semiconductor apparatus 1d of the third embodiment, when the instruction code for allowing execution of a safe process held in the register 14a is replaced by an unintended instruction code, erroneous transfer of data, for example, may be caused by the DMAC 31, and the functional safety of the semiconductor apparatus 1d may not be maintained.

To address such erroneous transfer, the semiconductor apparatus 1c of the modification is configured such that, when the instruction code for allowing execution of a safe process held in the register 14a is replaced by an unintended instruction code, instruction codes for allowing execution of a safe process are inputted from the registers 14b, 14c to the majority circuit 18. An instruction code for allowing execution of a safe process is selected through a majority decision made by the majority circuit 18, and is outputted to the multiplexer 15.

Therefore, the functional safety of the semiconductor apparatus 1e of the modification can be more reliably maintained than the semiconductor apparatus 1d of the third embodiment.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without depart-

What is claimed is:

1. A semiconductor apparatus comprising:
a storage unit configured to store data;
an Error Correction Code (ECC) decoder configured to be able to detect and correct an error of a predetermined number of bits in the data outputted from the storage unit, and detect an error equal to or larger than bits larger than the predetermined number of bits in the data;
a selection unit configured to select and output the data outputted from the ECC decoder when a detection signal indicating that the error equal to or larger than the bits larger than the predetermined number of bits is not detected by the ECC decoder is inputted from the ECC decoder, and to select and output a preset fixed value when a detection signal indicating that the error equal to or larger than the bits larger than the predetermined number of bits is detected by the ECC decoder is inputted from the ECC decoder;
a register configured to store the fixed value; and
a majority circuit obtained by multiplexing the register, and configured to output, to the selection unit, a majority of the fixed values from among the fixed values outputted from the respective multiplexed registers.

2. A semiconductor apparatus comprising:
a storage unit configured to store data;
an Error Correction Code (ECC) decoder configured to be able to detect and correct an error of one bit in the data outputted from the storage unit, and detect an error of two bits or more in the data;
a selection unit configured to select and output the data outputted from the ECC decoder when a detection signal indicating that the error of two bits or more is not detected by the ECC decoder is inputted from the ECC decoder, and to select and output a preset fixed value when a detection signal indicating that the error of two bits or more is detected by the ECC decoder is inputted from the ECC decoder;
a register configured to store the fixed value; and
a majority circuit obtained by multiplexing the register, and configured to output, to the selection unit, a majority of the fixed values from among the fixed values outputted from the respective multiplexed registers.

3. The semiconductor apparatus according to claim 2, wherein the preset fixed value is a value for maintaining functional safety of the semiconductor apparatus.

4. A semiconductor apparatus comprising:
a storage unit configured to store a vector address for allowing execution of an interruption process;
an Error Correction Code (ECC) decoder configured to be able to detect and correct an error of one bit in the vector address outputted from the storage unit, and detect an error of two bits or more in the vector address; and
a selection unit configured to select and output one of the vector address outputted from the ECC decoder and a vector address for allowing execution of a preset process, in accordance with a detection signal indicating whether or not the error of two bits or more is detected by the ECC decoder.

5. The semiconductor apparatus according to claim 4, wherein
the selection unit selects and outputs the vector address outputted from the ECC decoder when a detection signal indicating that no error of two bits or more is detected is inputted to the selection unit, and the selection unit selects and outputs the vector address for allowing execution of the preset process when a detection signal indicating that the error of two bits or more is detected is inputted to the selection unit.

6. The semiconductor apparatus according to claim 4, wherein the vector address for allowing execution of the preset process is a vector address for allowing execution of a safe process.

7. The semiconductor apparatus according to claim 4, further comprising a register configured to store a vector address for allowing execution of the preset process.

8. The semiconductor apparatus according to claim 7, further comprising a majority circuit obtained by multiplexing the register, and configured to output, to the selection unit, a majority of vector addresses for allowing execution of the preset process, from among vector addresses for allowing execution of the preset process outputted from the respective multiplexed registers.

9. The semiconductor apparatus according to claim 4, wherein the storage unit is configured to store an instruction code for a DMA controller;
the ECC decoder is configured to be able to detect and correct an error of one bit in the instruction code outputted from the storage unit, and detect an error of two bits or more in the instruction code; and
the selection unit is configured to select and output one of the instruction code outputted from the ECC decoder and an instruction code for allowing execution of a preset process, in accordance with a detection signal indicating whether or not the error of two bits or more is detected by the ECC decoder.

10. The semiconductor apparatus according to claim 7, wherein the selection unit selects and outputs the instruction code outputted from the ECC decoder when a detection signal indicating that no error of two bits or more is detected is inputted to the selection unit, and the selection unit selects and outputs the instruction code for allowing execution of the preset process when a detection signal indicating that the error of two bits or more is detected is inputted to the selection unit.

11. The semiconductor apparatus according to claim 9, wherein the instruction code for allowing execution of the preset process is an instruction code for allowing execution of a safe process.

12. The semiconductor apparatus according to claim 9, further comprising a register configured to store the instruction code for allowing execution of the preset process.

13. The semiconductor apparatus according to claim 12, further comprising
a majority circuit obtained by multiplexing the register, and configured to output, to the selection unit, a majority of instruction codes for allowing execution of a safe process, from among instruction codes for allowing execution of the safe process outputted from the respective multiplexed registers.

14. The semiconductor apparatus according to claim 1, wherein the storage unit is an SRAM, a ROM, or a NAND flash memory.

15. The semiconductor apparatus according to claim 1, wherein the preset fixed value is a value for maintaining functional safety of the semiconductor apparatus.

16. The semiconductor apparatus according to claim 2, wherein the storage unit is an SRAM, a ROM, or a NAND flash memory.

\* \* \* \* \*